(12) United States Patent
Bonilla et al.

(10) Patent No.: US 8,755,942 B2
(45) Date of Patent: Jun. 17, 2014

(54) HEATING, VENTILATION AND AIR CONDITIONING SYSTEM CONTROLLER HAVING A MULTIFUNCTIONAL INDOOR AIR QUALITY SENSOR AND METHOD OF CONTROLLING THE SYSTEM BASED ON INPUT FROM THE SENSOR

(75) Inventors: Absalon Bonilla, Carrollton, TX (US); Carlos O. Chamorro, Plano, TX (US); Richard A. Mauk, Lewisville, TX (US)

(73) Assignee: Lennox Industries, Inc., Richardson, TX (US)

( * ) Notice: Subject to any disclaimer, the term of this patent is extended or adjusted under 35 U.S.C. 154(b) by 615 days.

(21) Appl. No.: 12/694,372

(22) Filed: Jan. 27, 2010

(65) Prior Publication Data
US 2010/0298981 A1 Nov. 25, 2010

Related U.S. Application Data

(60) Provisional application No. 61/180,405, filed on May 21, 2009.

(51) Int. Cl.
*G05B 15/00* (2006.01)
*F25B 1/00* (2006.01)

(52) U.S. Cl.
USPC .............................. 700/276; 62/498

(58) Field of Classification Search
USPC .............. 700/276, 277; 62/498; 454/239, 900
See application file for complete search history.

(56) References Cited

U.S. PATENT DOCUMENTS

| | | | |
|---|---|---|---|
| 6,782,351 B2 * | 8/2004 | Reichel et al. | 702/188 |
| 6,941,193 B2 * | 9/2005 | Frecska et al. | 700/276 |
| 2005/0076655 A1 * | 4/2005 | Wong | 62/78 |
| 2006/0032245 A1 * | 2/2006 | Kates | 62/129 |
| 2006/0234621 A1 * | 10/2006 | Desrochers et al. | 454/239 |
| 2008/0182506 A1 * | 7/2008 | Jackson et al. | 454/354 |

* cited by examiner

*Primary Examiner* — Sean Shechtman
*Assistant Examiner* — Steven Garland

(57) ABSTRACT

An HVAC controller and a method of controlling an HVAC system. In one embodiment, the controller includes: (1) a processor couplable to at least one indoor air quality sensor to receive values therefrom representing at least three levels of indoor air quality and (2) memory coupled to the processor and configured to store a software program capable of causing the processor to control an HVAC system based on magnitudes of the values.

21 Claims, 3 Drawing Sheets

HEATING, VENTILATION AND AIR CONDITIONING SYSTEM CONTROLLER HAVING A MULTIFUNCTIONAL INDOOR AIR QUALITY SENSOR AND METHOD OF CONTROLLING THE SYSTEM BASED ON INPUT FROM THE SENSOR

CROSS-REFERENCE TO RELATED APPLICATION

This application claims the benefit of U.S. Provisional Application Ser. No. 61/180,405, filed by Mark Beste, et al., on May 21, 2009, entitled "Comprehensive HVAC Control System," commonly assigned with this application and incorporated herein by reference.

TECHNICAL FIELD

This application is directed, in general, to heating, ventilation and air conditioning (HVAC) systems and, more specifically, to an HVAC system controller having a multifunctional indoor air quality sensor and a method of controlling the HVAC system based on input from the sensor.

BACKGROUND

Some conventional HVAC systems are capable of employing dry contact (discrete on-off switch) indoor air quality sensors to detect when carbon dioxide ($CO_2$) or volatile organic compounds (VOCs) reach a level of concentration regarded as potentially harmful. The design of the sensors themselves reflects that level of concentration. For example, one dry contact $CO_2$ sensor may be designed to change state when the CO concentration reaches 1000 parts per million (PPM), while another may be designed to change state when the $CO_2$ concentration reaches 5000 PPM. Conventional HVAC systems have employed dry contact indoor air quality sensors to advantage, and customers and users of such systems have benefited from the integration of such sensors into such systems.

SUMMARY

One aspect provides an HVAC controller. In one embodiment, the controller includes: (1) a processor couplable to at least one indoor air quality sensor to receive values therefrom representing at least three levels of indoor air quality and (2) memory coupled to the processor and configured to store a software program capable of causing the processor to control an HVAC system based on magnitudes of the values.

Another aspect provides a method of controlling an HVAC system. In one embodiment, the method includes: (1) receiving values from at least one indoor air quality sensor, the values representing at least three levels of indoor air quality and (2) controlling the HVAC system based on magnitudes of the values.

Yet another aspect provides an HVAC system. In one embodiment, the system includes: (1) an outdoor unit, including: (1a) at least one compressor stage, (1b) at least one corresponding condenser fan, (1c) at least one corresponding refrigerant pressure sensor, and (1d) at least one condenser coil, (2) an indoor unit, including: (2a) at least one evaporator coil, (2b) at least one indoor blower and (2c) at least one expansion valve, (3) at least one damper and (4) an HVAC controller, including: (4a) a processor couplable to at least one indoor air quality sensor to receive values therefrom representing at least three levels of indoor air quality and (4b) memory coupled to the processor and configured to store a software program capable of causing the processor to control the HVAC system based on magnitudes of the values.

BRIEF DESCRIPTION

Reference is now made to the following descriptions taken in conjunction with the accompanying drawings, in which.

DETAILED DESCRIPTION

As stated above, conventional HVAC systems have employed dry contact indoor air quality sensors to advantage, and customers and users of such systems have benefited from the integration of such sensors into such systems. However, it is realized herein that more effective steps may be taken to detect and react to changes in indoor air quality were quantitative air quality data available. Further, it is also realized herein that indoor air quality may be improved more comprehensively were an array of pollutants broader than $CO_2$ and VOCs, such as radon, molds and other allergens, legionella and other bacteria, asbestos fibers, carbon monoxide (CO), ozone ($O_3$) and other potentially harmful substances, taken into account. It is also realized herein that various types and degrees of air quality deficiency may be identified and responded to or compensated for in various ways and to various degrees. Accordingly, introduced herein are various controllers and methods for gathering and analyzing quantitative indoor air quality data and controlling an HVAC system based thereon.

Figure 1:
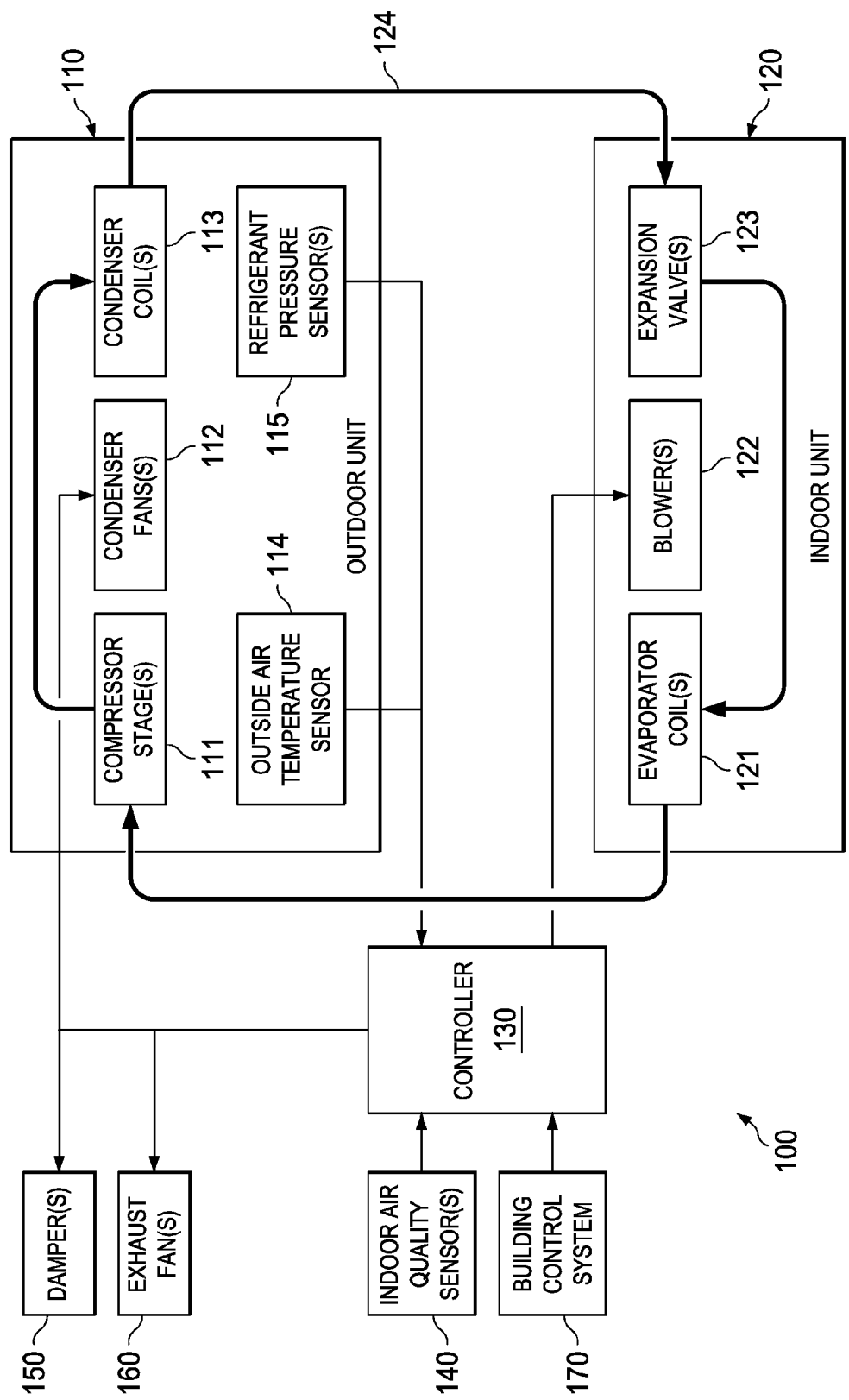
FIG. 1 is a block diagram of an HVAC system containing one embodiment of a controller having a multifunctional indoor air quality sensor connector constructed according to the principles of the invention.

FIG. 1 is a block diagram of an HVAC system 100 containing one embodiment of a controller having a multifunctional indoor air quality sensor connector constructed according to the principles of the invention. The HVAC system 100 includes an outdoor unit 110, which may be a rooftop unit, and an indoor unit 120. The outdoor unit 110 and the indoor unit 120 are represented as being separate, but in fact may be housed in a common enclosure. The outdoor unit 110 of FIG. 1 is air-cooled. However, the outdoor unit 110 is liquid-cooled in an alternative embodiment.

The illustrated embodiment of the outdoor unit 110 includes one or more compressors each having one or more stages 111. One or more condenser fans 112 are associated with one or more condenser coils 113 to move air across the one or more condenser coils 113. An outside air temperature sensor 114 is situated in or on the outdoor unit 110 to detect an ambient outdoor air temperature, and one or more refrigerant pressure sensors 115 are situated in or on the outdoor unit to detect refrigerant pressure in the one or more condenser coils 113. In the illustrated embodiment, at least one refrigerant pressure sensor, a low ambient pressure switch, is associated with each condenser coil and is configured to change switch state (open or close) as a function of the pressure of refrigerant in its associated coil relative to a pre-established pressure at a lower end of an acceptable pressure range. In another embodiment, a high ambient pressure switch is also associated with each condenser coil and is configured to change switch state as a function of the pressure of refrigerant in its associated coil relative to a pre-established pressure at a higher end of an acceptable pressure range.

The illustrated embodiment of the indoor unit 120 includes one or more evaporator coils 121. One or more blowers 122, sometimes known as indoor blowers, are associated with the one or more evaporator coils 121 to move air across the one or more evaporator coils 121. One or more expansion valves 123 are coupled to one or more corresponding refrigerant conduits 124. The one or more refrigerant conduits 124 couple the one or more stages 111 of the one or more compressors, the one or more condenser coils 113, the one or more expansion valves 123 and the one or more evaporator coils 121 to form a loop within which a refrigerant (e.g., a hydrofluorocarbon fluid or carbon dioxide) is repeatedly compressed, cooled, decompressed and warmed to effect air conditioning. In one embodiment, the indoor unit 120 includes one or more heater coils (not shown) associated with the one or more blowers 122 to effect heating. In another embodiment, the one or more blowers 122 may be activated separately to effect ventilation.

As stated above, the illustrated embodiment of the system 100 further includes an HVAC controller 130. The illustrated embodiment of the controller 130 is configured to receive input signals from, perhaps among other things, the outside air temperature sensor 114, the one or more refrigerant pressure sensors 115 and one or more indoor air quality sensors 140. Based on one or more of these input signals, the controller 130 is further configured to generate output signals to control, perhaps among other things, the one or more condenser fans 112, the one or more blowers 122, one or more dampers 150 and one or more exhaust fans 160 that, in turn, direct air through ducts associated with the one or more blowers 122. The illustrated embodiment has two or more dampers 150. One or more of the dampers 150 may be located where duct pressure is less than outside ambient air pressure and opened to admit outside air into the ducts, where it mixes with indoor air. One or more dampers may be located where duct pressure is greater than the outside ambient air pressure and opened to exhaust indoor air to the outside environment. The one or more dampers 150 may have one or more fans associated therewith to allow exhaust and ventilation rates to be changed (increased or decreased).

A user interface (not shown), perhaps including an indoor temperature sensor, a message screen and an alarm annunciator (such as a bell, a public-address speaker, a telephone message generator, or a computer network gateway), is coupled to the controller 130 and configured to allow a user to select a setpoint indoor temperature and perhaps a system operational mode (i.e., air conditioning, heating or ventilation) and also display information about the HVAC system 100, including providing alarms and other messages. The controller 130 may provide at least some of these alarms and messages to a building control system 170 and, in some embodiments, receives data from the building control system 170 as well. Those skilled in the pertinent art are familiar with the manner in which HVAC systems, such as the HVAC system 100 of FIG. 1, may be controlled by a user. Those skilled in the pertinent art are also familiar with alarm annunciators that are conventionally associated with fire systems, including those that include bells or speakers to alert building occupants and provide instructions when a fire or other condition is detected.

As stated above, the illustrated embodiment of the system 100 further includes one or more indoor air quality sensors 140 coupled to the controller 130. The one or more sensors 140 may be of any type or combinations of conventional or later-developed type. The one or more sensors 140 may produce analog or digital values that represent quantitative measurements the one or more sensors 140 make. If analog, the values may be converted to digital form before being provided to the processor 210. The controller 130 then receives the analog or digital values and employs them as an input to one or more response processes. In the illustrated embodiment, the one or more response processes take the form of one or more software programs employable to evaluate the inputs, including their type and the magnitude of their values, and decide upon a correct action to take in response. The output of the one or more response processes may then be used to control the HVAC system and thereby respond to indoor air quality issues that may arise.

Figure 2:
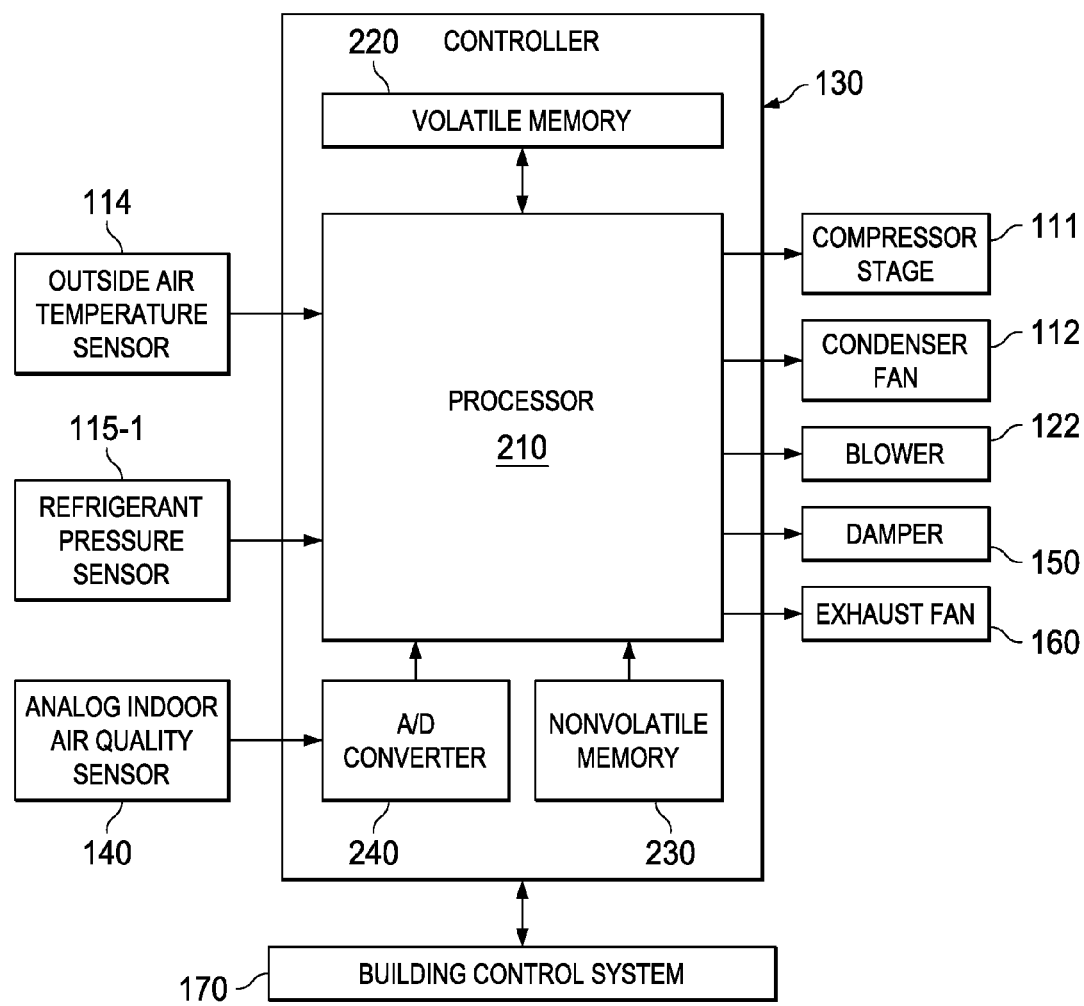
FIG. 2 is a block diagram of one embodiment of the controller of FIG. 1.

FIG. 2 is a block diagram of one embodiment of the controller 130 of FIG. 1. In the embodiment of FIG. 2, the controller 130 takes the form of a general purpose microcontroller and contains a processor 210 configured to execute software (e.g., firmware) instructions, a volatile memory 220 coupled to the processor 210 and configured to store software instructions, data or both software instructions and data and nonvolatile memory 230 coupled to the processor 210 and configured to store software instructions, data or both software instructions and data. In the embodiment of FIG. 2, the nonvolatile memory 230 stores the software instructions and persistent data (e.g., factory settings and messages) that enable the operation of the controller 130, including the response processes, and the volatile memory 220 stores data that the controller 130 collects during its operation and stores temporarily for internal use or external recall (e.g., scratchpad data and operational logs).

As FIG. 2 shows, an outside air temperature sensor 114, a refrigerant pressure sensor 115 and the indoor air quality sensor 140 of FIG. 1 are coupled to the processor 210 to provide input signals thereto. In the embodiment of FIG. 1, the indoor air quality sensor 140 provides analog input signals that an analog-to-digital converter 240 then converts to digital values that the processor 210 can employ. Likewise, the processor 210 is coupled to a compressor stage 111, a corresponding condenser fan 112 and inlet and exhaust dampers 150.

Having set forth several embodiments of an HVAC system and a controller, several examples of response processes will now be set forth. In a first example, the indoor air quality sensor is a CO sensor, and the values that the CO sensor is providing to the controller 130 indicates a relatively minor CO issue in one part of a building. An example response process may therefore just increase the ventilation rate of the HVAC system as a whole (e.g., increase the speed of the one or more blowers 122 and modulate the outdoor air damper to allow more fresh air into the building) to distribute the CO and reduce its local concentration to acceptable levels.

In a second example, the indoor air quality sensor remains a CO sensor, and the values that the CO sensor is providing to the controller 130 indicates a moderate CO issue in the building. The example response process may therefore open an inlet damper 150 to admit outside air into the building to reduce the CO concentration to acceptable levels.

In a third example, the indoor air quality sensor is again a CO sensor, and the values that the CO sensor is providing to the controller 130 indicates a major CO issue in the building. The example response process may therefore increase the ventilation rate of the HVAC system, open an exhaust damper 150 and turn on an exhaust fan 160 to exhaust indoor air to the outside and activate the alarm annunciator, perhaps via the building control system 170, to prompt building occupants to exit the building.

In a fourth example, the indoor air quality sensor is a mold sensor, and the values that the mold sensor is providing to the controller 130 indicates a moderate mold problem in one part of the building. The example response process may therefore increase the ventilation rate of the HVAC system in that part of the building, cause a warning message to be displayed on user interfaces in that part of the building and cause a further warning message to be transmitted via the building control system 170 to a building management company and/or a mold remediation service.

In a fifth example, the indoor air quality sensor is a VOC sensor, and the values that the VOC sensor is providing to the controller 130 indicates a major VOC issue in the building, with an attendant fire risk. The example response process may therefore (1) reduce the ventilation rate of the HVAC system to zero to keep the VOCs from spreading, (2) activate alarm codes to cause ventilation in other areas of the building to increase to keep VOC particles concentrated in the particular zone where they were detected and not allow them to spread through doors, windows or return ducts and (3) activate the alarm annunciator perhaps via the building control system 170 to prompt building occupants to exit the building, cause a VOC alarm message to be transmitted to building management and call the local authorities. As one skilled in the art can readily see, the examples given here are but a small subset of possible examples given the many types of indoor air quality sensors that may be employed, the many magnitudes of values that such sensors may provide and the many types of responses that an HVAC system may make to such magnitudes. The invention fully contemplates and encompasses all such sensors, magnitudes and responses.

Figure 3:
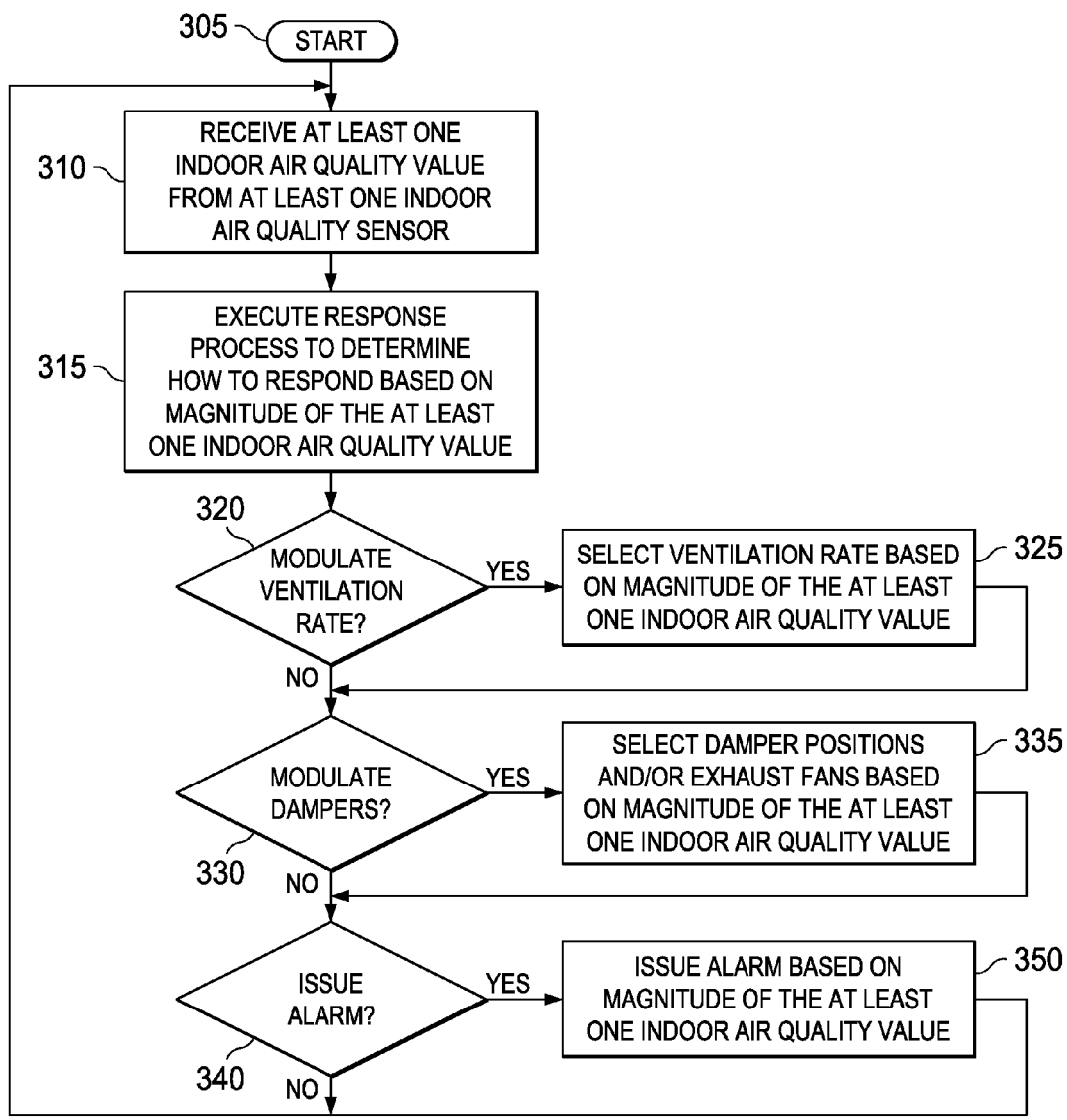
FIG. 3 is a flow diagram of one embodiment of a method of controlling an HVAC system based on input from a multifunctional indoor air quality sensor connector carried out according to the principles of the invention.

FIG. 3 is a flow diagram of one embodiment of a method of controlling an HVAC system based on input from a multifunctional indoor air quality sensor connector carried out according to the principles of the invention. The method begins in a start step 305. In a step 310, at least one indoor air quality value is received from at least one indoor air quality sensor. In a step 315, a response process is executed to determine how to respond based on magnitude of the at least one indoor air quality value. In a decisional step 320, it is determined whether the response process calls for the ventilation rate of the HVAC system to be changed. If so, a ventilation rate based on the magnitude of the at least one indoor air quality value is selected in a step 325.

In a decisional step 330, it is determined whether the response process instead or also calls for one or more dampers in the HVAC system to be moved and if one or more exhaust fans are to be turned on. If so, damper positions and fans are selected based on the magnitude of the at least one indoor air quality value. In a decisional step 340, it is determined whether the response process instead or also calls for an alarm to be issued. If so, an alarm is issued based on the magnitude of the at least one indoor air quality value in a step 350. The method then returns to the step 310, in which subsequent indoor air quality values are received, and the step 320, in which subsequent response processes are executed to determine whether responses should be undertaken and, if so, what those responses should be.

Those skilled in the art to which this application relates will appreciate that other and further additions, deletions, substitutions and modifications may be made to the described embodiments.

What is claimed is:

1. An HVAC controller of an HVAC system for an enclosure, comprising:
   a processor coupled to a plurality of indoor air quality sensors of multiple types to receive values therefrom, wherein values received from one of said indoor air quality sensors indicate a type of said one of said indoor air quality sensors, a magnitude of said received values, and a part of said enclosure said received values affect; and
   memory coupled to said processor and storing a software program causing said processor to control said HVAC system based on said received values.

2. The controller as recited in claim 1 wherein said software program has program instructions causing said processor to select a ventilation rate based on said magnitude.

3. The controller as recited in claim 1 wherein said software program has program instructions causing said processor to select a position of at least one damper based on said magnitude.

4. The controller as recited in claim 1 wherein said software program has program instructions causing said processor to issue an alarm based on said magnitude.

5. The controller as recited in claim 1 wherein said software program has program instructions causing said processor to perform at least two actions selected from the group consisting of:
   selecting a ventilation rate based on said magnitude,
   selecting a position of at least one damper based on said magnitude,
   turning on at least one exhaust fan based on said magnitude, and
   issuing an alarm based on said magnitude.

6. The controller as recited in claim 1 wherein at least one of said plurality of indoor air quality sensors is selected from the group consisting of:
   a carbon dioxide sensor,
   a volatile organic compound sensor,
   a radon sensor,
   a molds sensor,
   an allergen sensor,
   a legionella sensor,
   a bacteria sensor,
   an asbestos fiber sensor,
   a carbon monoxide sensor, and
   an ozone sensor.

7. The controller as recited in claim 1 wherein at least one of said plurality of indoor air quality sensors is configured to provide analog output signals, said system further comprising at least one corresponding analog-to-digital converter configured to receive said analog output signals and generate said values as a function thereof.

8. A method of controlling an HVAC system for an enclosure, comprising:
   receiving values from a plurality of indoor air quality sensors of multiple types, wherein values received from one of said indoor air quality sensors indicate a type of said one of said indoor air quality sensors, a magnitude of said received values, and a part of said enclosure said received values affect; and
   controlling said HVAC system based on said received values.

9. The method as recited in claim 8 wherein said controlling comprises selecting a ventilation rate based on said magnitude.

10. The method as recited in claim 8 wherein said controlling comprises selecting a position of at least one damper based on said magnitude.

11. The method as recited in claim 8 wherein said controlling comprises issuing an alarm based on said magnitude.

12. The method as recited in claim 8 wherein said controlling comprises performing at least two actions selected from the group consisting of:
- selecting a ventilation rate based on said magnitude,
- selecting a position of at least one damper based on said magnitude,
- turning on at least one exhaust fan based on said magnitude, and
- issuing an alarm based on said magnitude.

13. The method as recited in claim 8 wherein at least one of said plurality of indoor air quality sensors is selected from the group consisting of:
- a carbon dioxide sensor,
- a volatile organic compound sensor,
- a radon sensor,
- a molds sensor,
- an allergen sensor,
- a legionella sensor,
- a bacteria sensor,
- an asbestos fiber sensor,
- a carbon monoxide sensor, and
- an ozone sensor.

14. The method as recited in claim 8 wherein at least one of said plurality of indoor air quality sensors is configured to provide analog output signals, said method further comprising:
- receiving said analog output signals; and
- generating said values as a function thereof.

15. An HVAC system, comprising:
- an outdoor unit, including:
  - at least one compressor stage,
  - at least one corresponding condenser fan,
  - at least one corresponding refrigerant pressure sensor, and
  - at least one condenser coil;
  - at least one outside temperature sensor;
- an indoor unit, including:
  - at least one evaporator coil,
  - at least one indoor blower, and
  - at least one expansion valve;
- at least one damper; and
- an HVAC controller, including:
  - a processor coupled to a plurality of indoor air quality sensors of multiple types, said at least one corresponding refrigerant pressure sensor, and said at least one outside temperature sensor to receive values therefrom, wherein values received from one of said indoor air quality sensors indicate a type of said one of said indoor air quality sensors, a magnitude of said received values, and a part of said enclosure said received values affect; and
  - memory coupled to said processor and storing a software program causing said processor to control said HVAC system based on said received values.

16. The system as recited in claim 15 wherein said software program has program instructions causing said processor to select a speed of said at least one blower based on said magnitude.

17. The system as recited in claim 15 wherein said software program has program instructions causing said processor to select a position of said at least one damper based on said magnitude.

18. The system as recited in claim 15 wherein said software program has program instructions causing said processor to issue an alarm based on said magnitude.

19. The system as recited in claim 15 wherein said software program has program instructions causing said processor to perform at least two actions selected from the group consisting of:
- selecting a speed of said at least one blower based on said magnitude,
- selecting a position of said at least one damper based on said magnitude,
- turning on at least one exhaust fan based on said magnitude, and
- issuing an alarm based on said magnitude.

20. The system as recited in claim 15 wherein at least one of said plurality of indoor air quality sensors is selected from the group consisting of:
- a carbon dioxide sensor,
- a volatile organic compound sensor,
- a radon sensor,
- a molds sensor,
- an allergen sensor,
- a legionella sensor,
- a bacteria sensor,
- an asbestos fiber sensor,
- a carbon monoxide sensor, and
- an ozone sensor.

21. The system as recited in claim 15 wherein at least one of said plurality of indoor air quality sensors is configured to provide analog output signals, said system further comprising at least one corresponding analog-to-digital converter configured to receive said analog output signals and generate said values as a function thereof.

* * * * *